United States Patent
Saada et al.

(10) Patent No.: US 9,998,238 B2
(45) Date of Patent: Jun. 12, 2018

(54) METHOD AND DEVICE FOR MITIGATING INTERFERENCE DUE TO A WIRELESS CHARGING SIGNAL

(71) Applicant: INTEL IP CORPORATION, Santa Clara, CA (US)

(72) Inventors: Yossi Saada, Haifa (IL); Christoph Schultz, Essen (DE); Ron Rotstein, Tel Aviv (IL)

(73) Assignee: Intel IP Corporation, Santa Clara, CA (US)

(*) Notice: Subject to any disclaimer, the term of this patent is extended or adjusted under 35 U.S.C. 154(b) by 0 days. days.

(21) Appl. No.: 15/491,123

(22) Filed: Apr. 19, 2017

(65) Prior Publication Data

US 2017/0324484 A1 Nov. 9, 2017

(30) Foreign Application Priority Data

May 9, 2016 (EP) ..................................... 16168749

(51) Int. Cl.

| H02J 50/00 | (2016.01) |
| H04B 15/02 | (2006.01) |
| H04B 17/00 | (2015.01) |
| H04B 1/10 | (2006.01) |
| H02J 7/02 | (2016.01) |
| H02J 50/12 | (2016.01) |
| H03B 1/04 | (2006.01) |

(52) U.S. Cl.
CPC .............. *H04B 15/02* (2013.01); *H02J 7/025* (2013.01); *H02J 50/12* (2016.02); *H03B 1/04* (2013.01); *H04B 1/10* (2013.01)

(58) Field of Classification Search
CPC ........ H04B 15/02; H04B 17/20; H04B 15/00; H02J 50/20; H02J 50/23; H02J 50/00; H02J 50/10
See application file for complete search history.

(56) References Cited

U.S. PATENT DOCUMENTS

| 8,929,957 B2* | 1/2015 | Toncich | H02J 7/025 455/573 |
| 9,065,686 B2* | 6/2015 | Sun | H04L 27/00 |
| 2014/0070763 A1* | 3/2014 | Chiles | H01F 38/14 320/108 |
| 2015/0326062 A1* | 11/2015 | Gonzalez Valdez | H02J 17/00 320/108 |

(Continued)

*Primary Examiner* — Blane Jackson
(74) *Attorney, Agent, or Firm* — International IP Law Group, P.L.L.C.

(57) ABSTRACT

The disclosure relates to a mobile device, comprising: a radio receiver configured to receive a radio signal; a power receiving unit (PRU) configured to receive a wireless charging signal from a power transmission unit (PTU) configured to charge the mobile device; a wireless broadcast receiver configured to receive a harmonic of the wireless charging signal during charging of the mobile device; a frequency manager configured to scan for a frequency of the harmonic and to detect a fundamental frequency of the wireless charging signal based on the scanned harmonic; and a mitigation module configured to mitigate a harmonic content of the wireless charging signal in the received radio signal based on the detected fundamental frequency of the wireless charging signal.

25 Claims, 9 Drawing Sheets

(56) References Cited

U.S. PATENT DOCUMENTS

2016/0056664 A1* 2/2016 Partovi ................... H02J 7/025
 307/104
2017/0070249 A1* 3/2017 Irish ..................... H04B 1/1027
2017/0093197 A1* 3/2017 Gao ........................ H02J 7/025

* cited by examiner

METHOD AND DEVICE FOR MITIGATING INTERFERENCE DUE TO A WIRELESS CHARGING SIGNAL

CROSS REFERENCE TO RELATED APPLICATION

The present application claims the priority of European Patent Application Serial No. 16168749.6, by Yossi Saada et al., entitled "METHOD AND DEVICE FOR MITIGATING INTERFERENCE DUE TO A WIRELESS CHARGING SIGNAL," filed May 9, 2016, and which is incorporated herein by reference.

FIELDS

The disclosure relates to a method and a device for mitigating a wireless charging signal in a received radio signal where the wireless charging signal is used for charging a mobile device. In particular, the disclosure relates to techniques to determine precise A4WP (Alliance for Wireless Power) PTU (Power Transmitting Unit) frequency using FM (frequency-modulation) radio or GNSS (Global Navigation Satellite System) radio to enable interference mitigation mechanisms.

BACKGROUND

The advent of A4WP (Alliance for Wireless Power) charging systems introduces new coexistence issues with the connectivity & cellular radio technologies implemented in mobile phones today. A PTU 120 (Power Transmitting Unit, typically referred to as a "charging mat") transfers power wirelessly 121 to a PRU (Power Receiving Unit, typically one or more mobile devices 130 as shown in FIG. 1) using resonant coupling at 6.78 MHz. Along with the fundamental continuous-wave tone used for power transfer, the PTU radiates a wide range of harmonics, some of which fall into RF bands 111 used within the PRU. These harmonics can severely desensitize the RF receivers operating while the mobile device 130 is being charged. User experience would be degraded to a different degree depending on the use case but preliminary testing suggests that using GNSS while the mobile device is placed on a car charging pad would be totally impossible as all four satellite constellations would be impacted by harmonics of the PTU signal. Modern radios (WLAN, BT, GNSS, FMR, Cellular Modem, etc. . . . ) are typically capable of applying specific mitigation technique(s) to combat narrowband spurious responses provided the frequency of the interferer is precisely known. The PTU fundamental frequency (and its harmonics) however are non-coherent with the reference clock(s) within the PRU so the PRU does not know a priori the precise frequency at which the harmonics will fall.

Due to the low fundamental frequency of the PTU, virtually all cellular and connectivity bands will have one or multiple harmonics falling in-band. Additionally, LTE and WIFI radio receivers operating with 20, 40 or 80 MHz channel bandwidths would suffer desensitization due to multiple PTU harmonics falling in-channel. To assess the severity of the problem, harmonics of a PTU to PRU wireless power transfer were measured for reference. Harmonics falling in the FMR band would cause desensitization on the order of 30 dB to the FMR receiver. Harmonic levels measured in the GNSS band (1560-1610 MHz) are in the −90 dBm range which would block any satellite signal acquisition.

It may thus be desirable to provide a technique for an accurate estimation of the fundamental frequency of the PTU.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. Like reference numerals designate corresponding similar parts.

DETAILED DESCRIPTION

Figure 1:
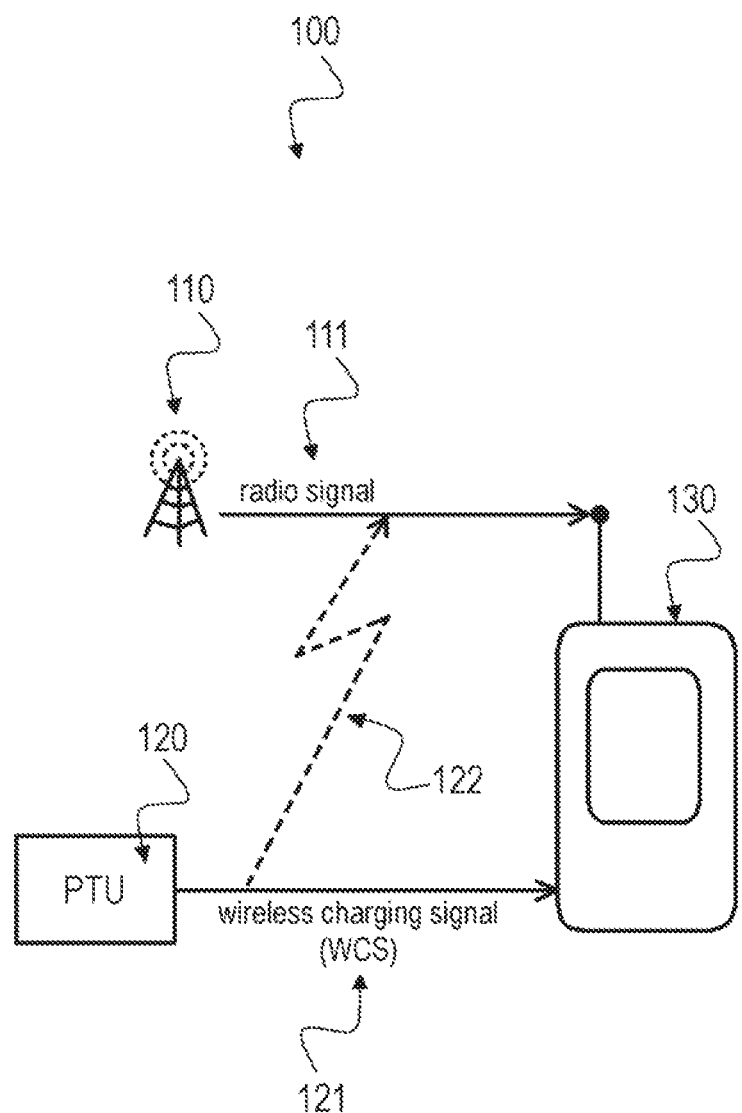
FIG. 1 is a schematic diagram illustrating a communication system 100 with a UE 130 charged by a PTU 120 while receiving a radio signal 111 from a base station 110.

In the following detailed description, reference is made to the accompanying drawings, which form a part thereof, and in which is shown by way of illustration specific aspects in which the invention may be practiced. It is understood that other aspects may be utilized and structural or logical changes may be made without departing from the scope of the present invention. The following detailed description, therefore, is not to be taken in a limiting sense. The following terms, abbreviations and notations will be used herein.

A2DP: Advanced Audio Distribution Profile
eSCO: Extended Synchronous Connection Oriented
VoLTE: Voice over LTE
DCO: Digitally Controlled Oscillator
A4WP: Alliance for Wireless Power
PTU: Power Transmitting Unit
PRU: Power Receiving Unit
ISM: Industrial Scientific Medical
RF: Radio Frequency
UE: User Equipment
BS: Base station, eNodeB
GNSS: Global Navigation Satellite System
GPS: Global Positioning System
WLAN: Wireless LAN
3GPP: 3rd Generation Partnership Project LTE: Long Term Evolution
WiFi: Wireless Fidelity, IEEE 802.11
BT: Bluetooth
FM: Frequency Modulation
FMR: Frequency Modulation Radio
TDD: Time Division Duplex
FDD: Frequency Division Duplex
DL: Downlink
UL: Uplink
TX: Transmitter
RX: Receiver
TX/RX: Transceiver
HLE: High-Level Entity
AP: Application Processor
SoC: System on Chip
GSM: Global System for Mobile communication
GPRS: General Packet Radio Service
EDGE: Enhanced Data Rates for GSM Evolution
WCDMA: Wideband Code Division Multiple Access
HSPA: High Speed Packet Access
SCDMA: Synchronous Code Division Multiple Access
HW: Hardware
FW: Firmware
EMI: Electromagnetic Interference
RSS: Received Signal Strength
RSSI: Received Signal Strength Indication
PLL: Phase Locked Loop
NCO: Numerically Controlled Oscillator
LPF: Low Pass Filter
OFDM: Orthogonal Frequency Division Multiplex
MIMO: Multiple Input Multiple Output
DCO: Digitally Controlled Oscillator It is understood that comments made in connection with a described method may also hold true for a corresponding device configured to perform the method and vice versa. For example, if a specific method step is described, a corresponding device may include a unit to perform the described method step, even if such a unit is not explicitly described or illustrated in the figures. Further, it is understood that the features of the various exemplary aspects described herein may be combined with each other, unless specifically noted otherwise.

The methods and devices described herein may be implemented in wireless communication networks, in particular communication networks based on mobile communication standards such as LTE, in particular LTE-A and/or OFDM. The methods and devices described below may further be implemented in a base station (NodeB, eNodeB) or a mobile device (or mobile station or User Equipment (UE)). The described devices may include integrated circuits and/or passives and may be manufactured according to various technologies. For example, the circuits may be designed as logic integrated circuits, analog integrated circuits, mixed signal integrated circuits, optical circuits, memory circuits and/or integrated passives.

The methods and devices described herein may be configured to transmit and/or receive radio signals. Radio signals may be or may include radio frequency signals radiated by a radio transmitting device (or radio transmitter or sender) with a radio frequency lying in a range of about 3 Hz to 300 GHz. The frequency range may correspond to frequencies of alternating current electrical signals used to produce and detect radio waves.

The methods and devices described herein after may be designed in accordance to mobile communication standards such as e.g. 3GPP standards such as the Long Term Evolution (LTE) standard or the advanced version LTE-A thereof.

LTE (Long Term Evolution), marketed as 4G, 5G LTE and beyond, is a standard for wireless communication of high-speed data for mobile phones and data terminals. The methods and devices described hereinafter may be applied in OFDM systems. OFDM is a scheme for encoding digital data on multiple carrier frequencies. A large number of closely spaced orthogonal subcarrier signals may be used to carry data. Due to the orthogonality of the sub-carriers crosstalk between sub-carriers may be suppressed.

The methods and devices described hereinafter may be applied in 802.11 standard body (WiFi) and Bluetooth systems or any near field communication (NFC) technology. WiFi is a local area wireless computer networking technology that allows electronic devices to connect to the network, mainly using the 2.4 gigahertz (12 cm) UHF and 5 gigahertz (6 cm) SHF ISM radio bands. The Wi-Fi Alliance defines Wi-Fi as any "wireless local area network" (WLAN) product based on the IEEE 802.11 standards. However, the term "Wi-Fi" is used in general English as a synonym for WLAN since most modern WLANs are based on these standards. Many devices can use WiFi, e.g. personal computers, video-game consoles, smartphones, digital cameras, tablet computers and digital audio players. These can connect to a network resource such as the Internet via a wireless network access point. Such an access point (or hotspot) has a range of about 20 meters indoors and a greater range outdoors.

Bluetooth is a wireless technology standard for exchanging data over short distances (using short-wavelength UHF radio waves in the ISM band from 2.4 to 2.4835 GHz) from fixed and mobile devices, and building personal area networks (PANs). It can connect several devices, overcoming problems of synchronization.

The methods and devices described hereinafter may be applied in LTE FDD mode systems, e.g. LTE mode systems having a type 1 LTE frame structure. The type 1 LTE frame includes 10 sub-frames each having two slots. A basic type 1 LTE frame has an overall length of 10 milliseconds. The methods and devices described hereinafter may be applied in LTE TDD mode systems, e.g. LTE mode systems having a type 2 LTE frame structure. The type 2 LTE frame has an overall length of 10 milliseconds. The 10 ms frame comprises two half frames, each 5 ms long. The LTE half-frames are further split into five subframes, each 1 millisecond long.

The methods and devices described hereinafter may be applied in MIMO systems. Multiple-input multiple-output (MIMO) wireless communication systems employ multiple antennas at the transmitter and at the receiver to increase system capacity and to achieve better quality of service. In spatial multiplexing mode, MIMO systems may reach higher peak data rates without increasing the bandwidth of the system by transmitting multiple data streams in parallel in the same frequency band.

The methods and devices described hereinafter may be applied in wireless power transfer (WPT) systems, in particular systems according to the A4WP standard. Wireless power transfer is the transmission of electrical energy from a power source to an electrical load, such as an electrical power grid or a consuming device, without the use of discrete man-made conductors. Wireless power is a generic term that refers to a number of different power transmission technologies that use time-varying electric, magnetic, or electromagnetic fields. In wireless power transfer, a wireless transmitter connected to a power source conveys the field energy across an intervening space to one or more receivers, where it is converted back to an electrical current and then utilized. Wireless transmission is useful to power electrical devices in cases where interconnecting wires are inconvenient, hazardous, or are not possible.

The Alliance For Wireless Power (A4WP) is an industry standard group that uses the principles of magnetic resonance to develop a wireless energy transfer system over distance. The WiPower system uses directed and controlled magnetic fields to replace traditional power cords. To do this, the transmitter utilizes one or more primary windings in order to induce a magnetic field above its surface. A receiver in the magnetic field uses a secondary winding which captures the magnetic energy and converts it back to electrical energy.

The A4WP standard does not impose any PTU frequency accuracy requirement other than transmitting within 6.78 MHz±15 kHz (ISM band) which corresponds to ±2212 ppm accuracy. As a result, the 15th harmonic of the PTU signal would fall anywhere in a ±225 kHz range around 101.7 MHz in the International FM radio band. Similarly, the 232th harmonic of the PTU signal would fall anywhere in a ±3.48 MHz range around 1572.96 MHz in the GPS and Galileo band. The uncertainty about the precise frequency of the harmonics prevents the radios within the mobile device to apply their mitigation mechanism without impairing the radio receiver performance.

Figure 2:
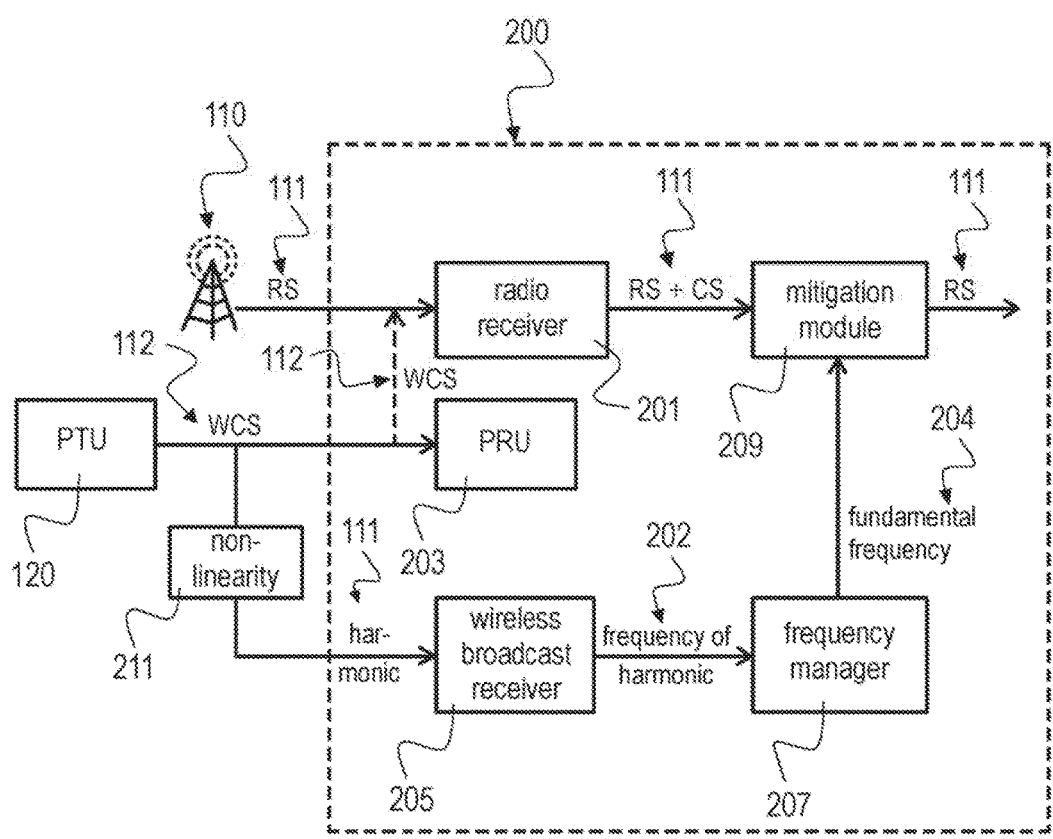
FIG. 2 is a block diagram 200 of a mobile device 200 with a frequency manager for detecting a fundamental frequency of a wireless charging signal according to the disclosure.

FIG. 2 is a block diagram 200 of a mobile device 200 with a frequency manager for detecting a fundamental frequency of a wireless charging signal according to the disclosure. The mobile device 200 includes a radio receiver 201, a power receiving unit (PRU) 203, a wireless broadcast receiver 205, a frequency manager 207 and a mitigation module 209.

The radio receiver 201 receives a radio signal (RS) 111 from a base station 110, e.g. as described above with respect to FIG. 1. The power receiving unit 203 receives a wireless charging signal (WCS) 121 from a power transmission unit (PTU) 120 which is configured to charge the mobile device 200. This WCS signal 121 may cause undesired interference 122 with the received radio signal 111 in the radio receiver 201. The wireless broadcast receiver 205 receives a harmonic 212 of the wireless charging signal 121 during charging of the mobile device 200. The harmonic 212 may be generated by passing the WCS signal 121 through a non-linearity 211, e.g. a non-linear amplifier. The frequency manager 207 scans for a frequency 202 of the harmonic 212 and detects a fundamental frequency 204 of the wireless charging signal 121 based on the scanned harmonic 212. The mitigation module 209 mitigates the harmonic content of the wireless charging signal 121 in the received radio signal 111 based on the detected fundamental frequency 204 of the wireless charging signal 121.

The radio receiver 201 may be a WLAN receiver, a Bluetooth (BT) receiver, a Global Navigation Satellite System (GNSS) receiver, a Frequency modulation radio (FMR) receiver or cellular mobile receiver or any other type of radio receiver.

The power receiving unit 203 may receive the wireless charging signal 121 in an Industrial, Scientific and Medical (ISM) radio frequency band. A frequency of the wireless charging signal 121 transmitted by the PTU 120 may lie within a frequency range of about 6.78 MHz+/−15 kHz. The PTU 120 and the PRU 203 may be designed according to the Alliance for Wireless Power (A4WP) standard. The wireless broadcast receiver 205 may be a broadcast radio receiver or a broadcast satellite receiver.

In one implementation, the broadcast radio receiver may be a Frequency Modulation Radio (FMR) Receiver. The frequency manager 207 may scan for a frequency 202 of the harmonic based on country information received by the radio receiver 201. The frequency manager 207 may scan for a frequency of a fourteenth or fifteenth harmonic of the wireless charging signal 121 if the country code indicates Japan. Otherwise, if the country code does not indicate Japan, the frequency manager 207 may scan for a frequency of a twelfth harmonic of the wireless charging signal 121.

The frequency manager 207 may select a harmonic of a plurality of harmonics of the wireless charging signal 121 received by the broadcast receiver 205 for scanning. The frequency manager 207 may perform a received signal strength scan in a frequency range around the selected harmonic with a grid of frequency bins. The frequency manager 207 may identify a frequency of a maximum of the scanned received signal strengths as the frequency 202 of the selected harmonic. The frequency manager 207 may repeat the received signal strength scan for at least one different harmonic selected from the plurality of harmonics.

The FMR receiver 205 may include a FM radio frequency tracking loop for locking on a tuned frequency and tracking a position of the tuned frequency relative to a reference crystal frequency of the mobile device 200. The frequency manager 207 may tune the FMR receiver 205 on the identified frequency of the selected harmonic. The frequency manager 207 may retrieve a channel word of the FM radio frequency tracking loop and may increase a precision of the identified frequency of the selected harmonic based on the retrieved channel word. The frequency manager 207 may detect the fundamental frequency 204 of the wireless charging signal 121 based on the identified frequency 202 and a rank of the selected harmonic 212.

In an alternative implementation, the broadcast radio receiver may be a broadcast satellite receiver, e.g. a Global Navigation Satellite System (GLASS) receiver. The frequency manager 207 may scan for the 232th harmonic of the wireless charging signal 121.

The GNSS receiver 205 may include a numerically controlled oscillator (NCO) configured to provide an NCO frequency; a downconverter to downconvert the received signal by the NCO frequency; a scan filter configured to filter the downconverted signal by a lowpass filter around zero frequency; an energy detector configured to detect an energy of the filtered signal; and an integrator configured to integrate the detected energy of the filtered signal to provide an average energy of the received signal.

The frequency manager 207 may select a harmonic of a plurality of harmonics of the wireless charging signal 121 received by the broadcast receiver 205 for scanning. The frequency manager 207 may perform an energy scan in a frequency range around the selected harmonic by successively tuning the NCO frequency on a grid of frequency bins. The frequency manager 207 may identify a frequency bin having an average energy corresponding to the selected harmonic of the wireless charging signal. A frequency distance of the grid of frequency bins may be smaller than a bandwidth of the lowpass filter. The frequency manager 207 may detect the fundamental frequency 204 of the wireless charging signal 121 based on the identified frequency bin and a rank of the selected harmonic.

Specific implementation forms of the components of the mobile device 200 are described in the following.

Figure 3:
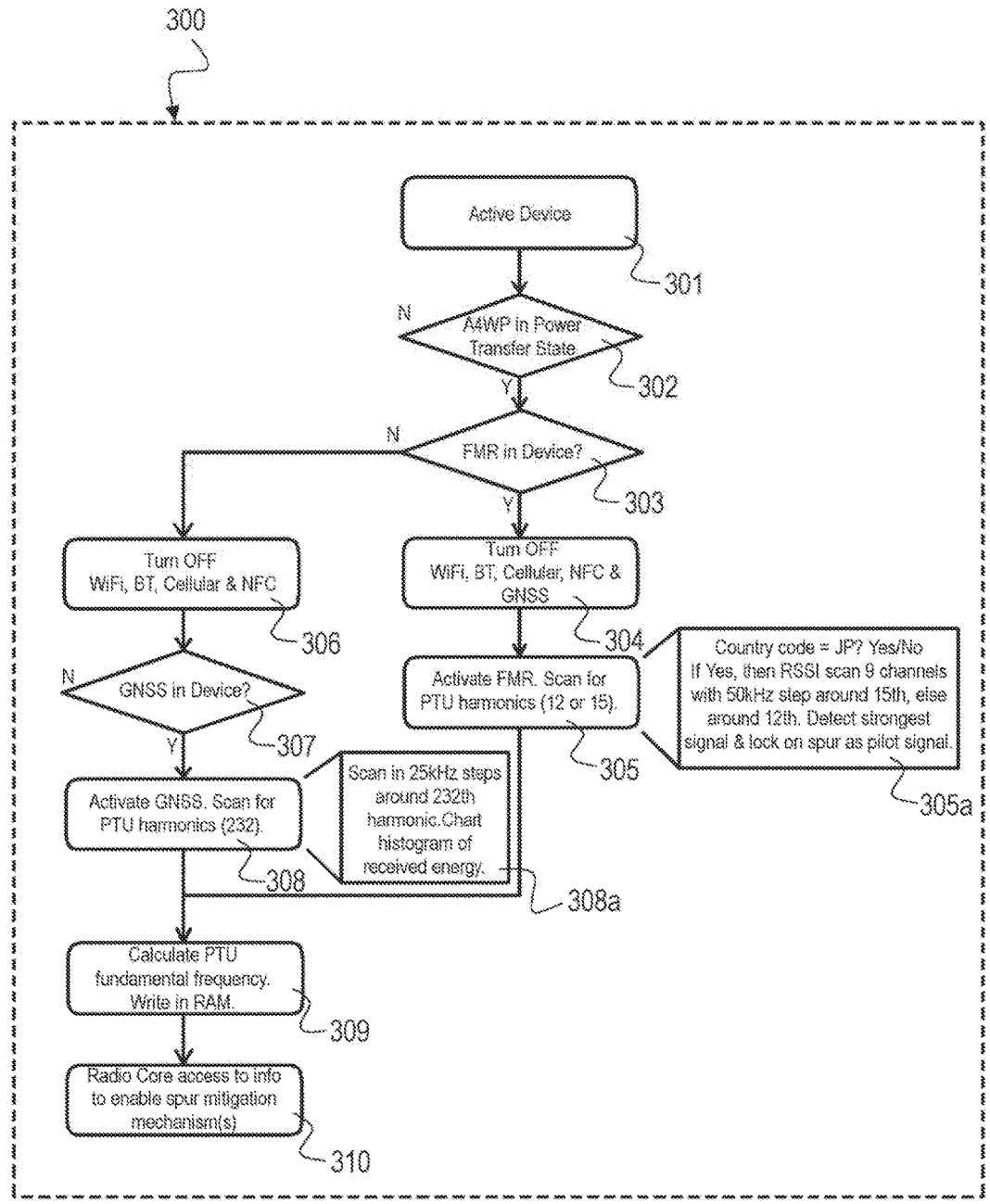
FIG. 3 is an exemplary process flow of a method 300 for deriving frequencies of PTU harmonics to apply spurious mitigation according to the disclosure.

FIG. 3 is an exemplary process flow 300 of a method for deriving frequencies of PTU harmonics to apply spurious mitigation according to the disclosure.

The process flow 300 starts with a first block 301 where an active device is provided, e.g. a mobile device such as a handset or a UE that include a FMR receiver (Rx) and/or a GNSS Rx. In a second block 302 a check is performed if A4WP is in power transfer state. If yes, in a third block 303 a check is performed if an FMR receiver is located in the device. If yes, in a fourth block 304 WIFI, BT, cellular, NFC and GNSS modules are turned off and in a fifth block 305 FMR is activated and a scan for PTU harmonics (12 or 15) is performed. This includes a further block 305a in which the country code is checked for being JP (Japan). If yes, then a RSSI scan of 9 channels with 50 kHz step around $15^{th}$ harmonic is performed, else around $12^{th}$ harmonic. The strongest channel is detected and a locking on spur as pilot signal is performed. Then a ninth block 309 is performed where PTU fundamental frequency is calculated and written in RAM and a tenth block 310 is performed where radio core access is informed to enable spur mitigation mechanisms, i.e. based on the detected PTU fundamental frequency.

If in the third block 303 the check is negative, a sixth block 306 is performed, where WIFI, BT, cellular and NFC modules are turned off. Then in a seventh block 307, a check is performed if the device, e.g. UE, includes a GNSS receiver. If yes, in an eighth block 308, the GNSS receiver is activated and a scan for PTU harmonics, i.e. for the 232th harmonic is performed. In a further block 308a it is described that the scan is performed in 25 kHz steps around the 232th harmonic. A histogram chart of received energy is provided. After this scan the process flow continues with the ninth block 309 as described above.

The technique according to the disclosure is applicable to mobile devices such as handsets and tablets that include a FMR receiver (Rx) and/or a GNSS Rx. The technique according to the disclosure consists of using the FMR or GNSS Rx to detect the precise PTU harmonic frequency, calculate the PTU fundamental frequency and store it into volatile memory so it can be used by a high-level entity (HLE) running on the system-on-a-chip (SoC) or application processor (AP). The HLE manages the frequencies of internally-generated and externally-injected spurious responses (either narrow or wideband). By knowing the PTU fundamental frequency, each radio modem on the mobile device (GSM/CPRS/EDGE, WCDMA/HSPA/TD-SCDMA, FDD-LTE, TDD-LTE, WLAN, BT, GNSS, as well as emerging wireless standards such as 5G) can derive the exact frequencies of the PTU harmonics that will affect the active band(s) of operation and use this information to apply spurious-mitigation techniques.

Figure 4:
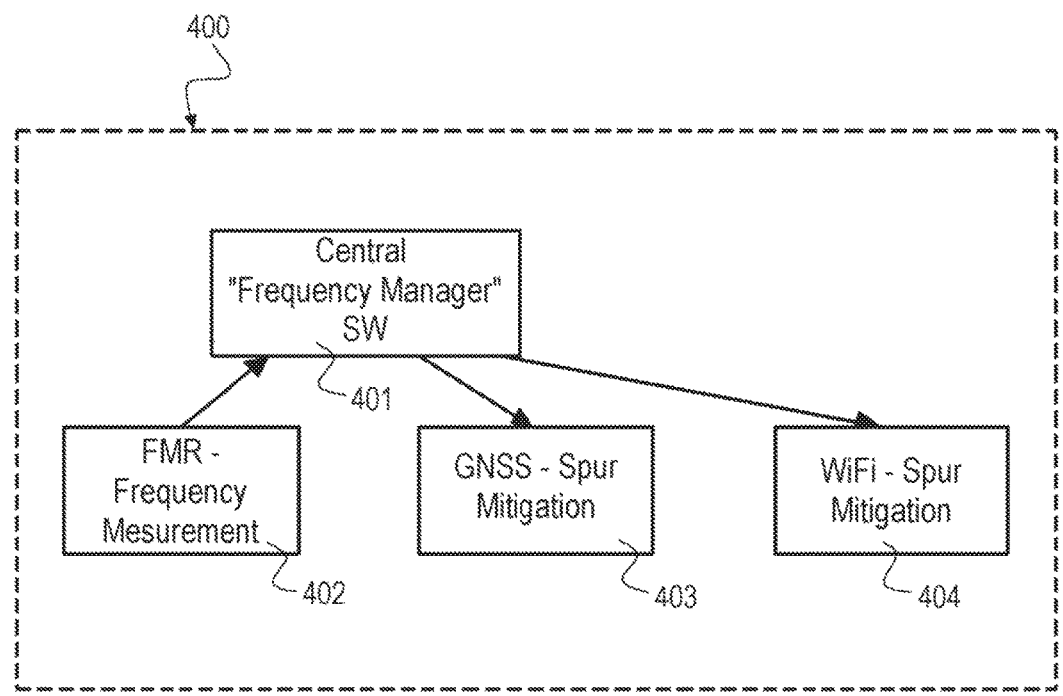
FIG. 4 is a schematic diagram of a mitigation system 400 according to the disclosure.

A practical implementation of such a process flow 300 is shown in FIG. 4.

FIG. 4 is a schematic diagram of a mitigation system 400 according to the disclosure. The mitigation system 400 includes one measurement block (e.g. FMR) 402, one management and control block (e.g. Frequency Manager) 401 and one or more mitigation blocks 403, 404 that receive the measured precise frequency as shown in FIG. 4.

Figure 5:
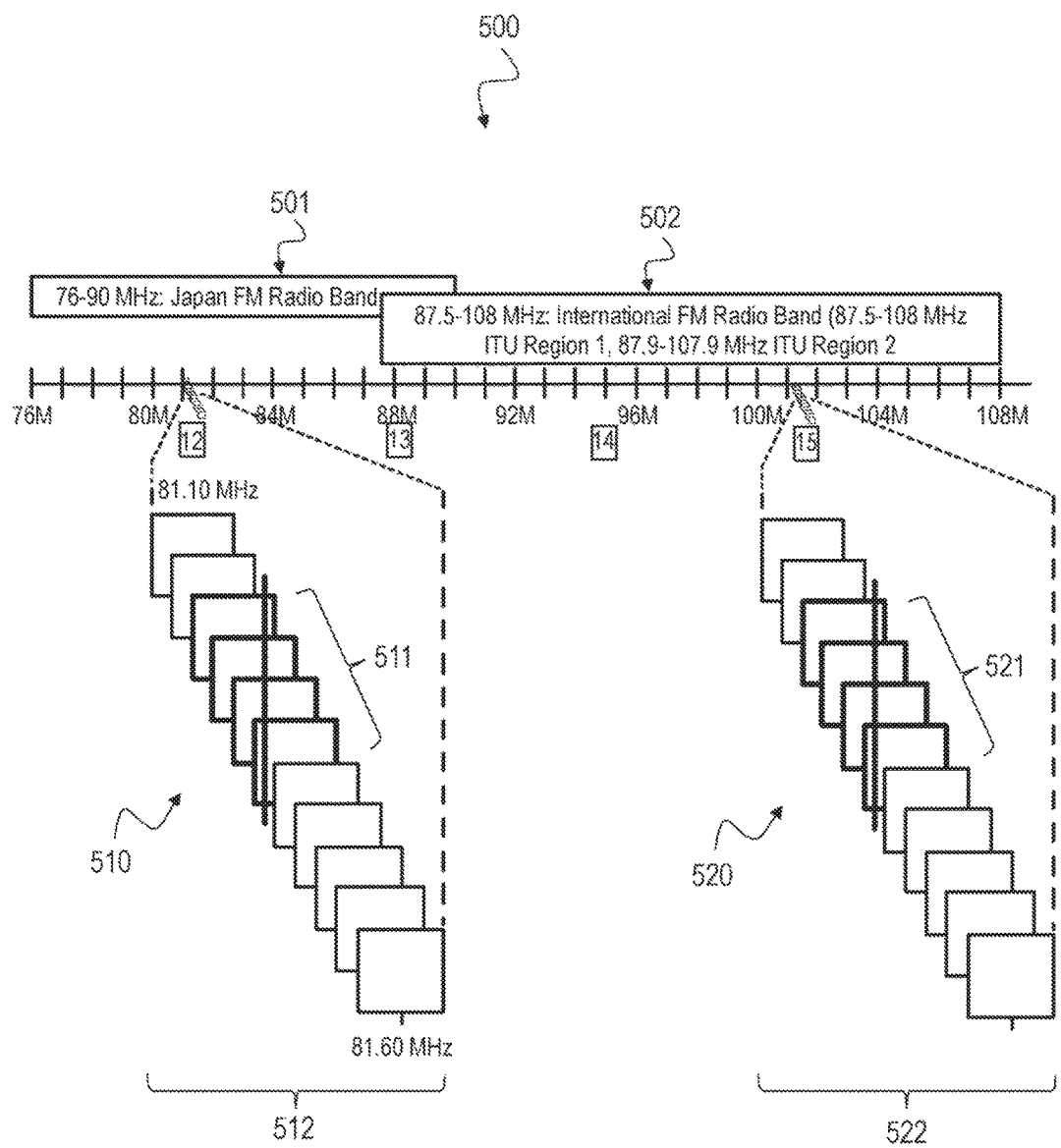
FIG. 5 is a frequency diagram 500 illustrating PTU harmonics in an FMR band.

To cancel any harmonic, the fundamental frequency has to be known to a high precision. To get an accurate measurement without any additional HW or FW cost, the inherent capabilities of the FM radio macro can be used. There are multiple reasons why FMR receiver is the preferred mean for detecting the PTU harmonic frequency:

First, the fact can be utilized that the lower the order of the harmonic, the narrower the required scan range to detect the PTU harmonic(s). With the exception of NFC radio, FMR uses the lowest RF frequency band in a mobile device. The 12th harmonic 510 falls in the Japan FMR band 501 as shown in FIG. 5. The 13th harmonic falls in the International FMR band 502 and the Japan FMR band 501. The 14th harmonic falls in the International FMR band 502 and the 15th harmonic 520 also falls in the International FMR band 502. The frequency range of each harmonic (with a fundamental accuracy of ±15 kHz) is shown in FIG. 5 for the $12^{th}$ to the $15^{th}$ harmonics (±180 kHz for the 12th harmonic 512, ±225 kHz for the 15th harmonic 522). The FMR receiver operates 200 kHz bandwidth channels on a 50 kHz raster so 11 FMR channels 512 can potentially be impacted by the 12th harmonic 510. Similarly, 13 FMR channels 522 can potentially be impacted by the $15^{th}$ harmonic 520. In an exemplary implementation, the wireless charging signal may fall within the parts 511 of the $12^{th}$ harmonic 510 and/or the parts 521 of the $15^{th}$ harmonic 520.

Second, the low order of the PTU harmonics ensures that each harmonic power level is high enough to be detected above the input-referred 200 kHz bandwidth noise floor yet sufficiently low to prevent any receiver compression or damage. The FMR antenna is typically the headset cable (which length is set to resonate at FMR frequencies) but it is not necessary to have this cable plugged in order to detect the PTU harmonics thanks to the particular sensitivity of the FMR receiver to ground signal & noise coupling.

Figure 6:
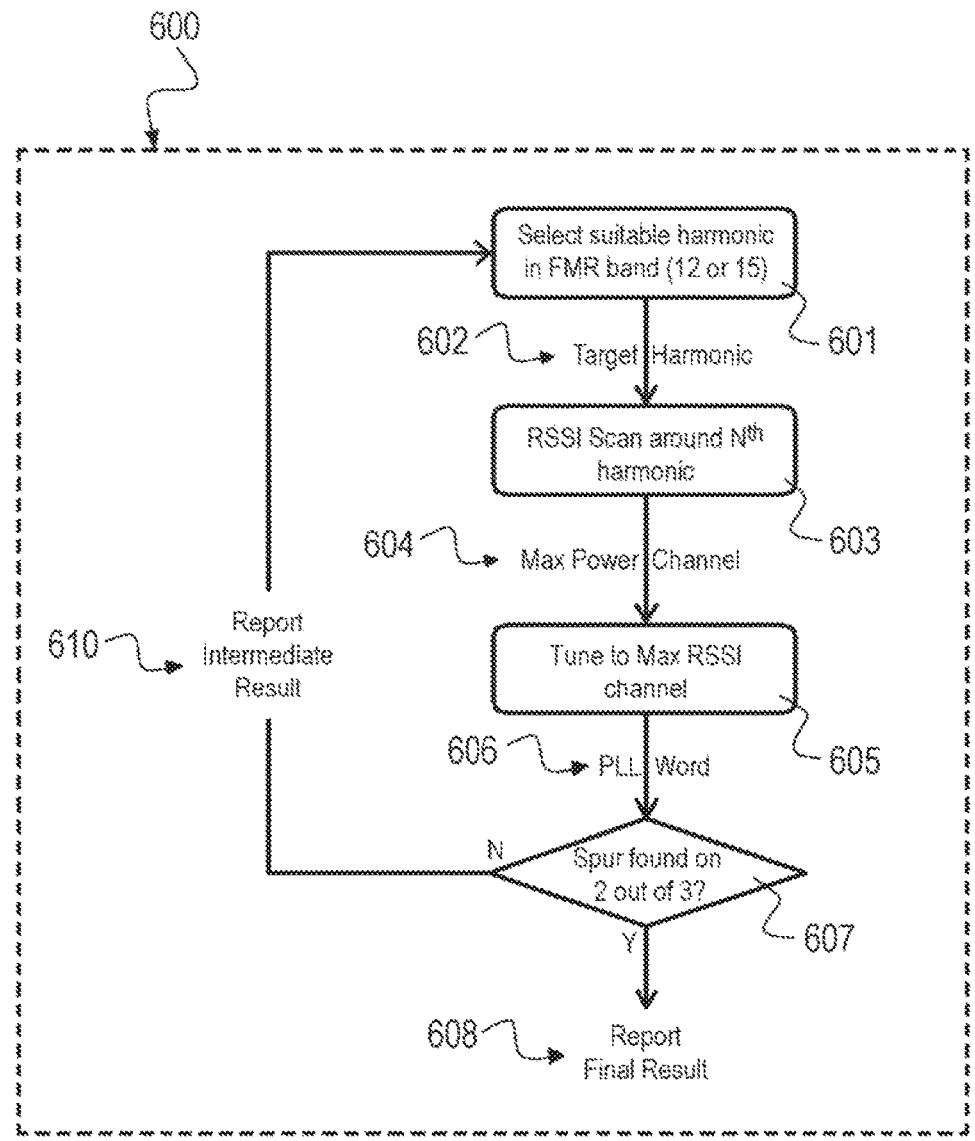
FIG. 6 is a schematic diagram illustrating a measurement procedure 600 for a single precise measurement method for deriving frequencies of PTU harmonics according to the disclosure.

FIG. 6 is a schematic diagram illustrating a measurement procedure 600 for a single precise measurement of a method for deriving frequencies of PTU harmonics according to the disclosure.

In a first block 601, a suitable harmonic is selected in FMR band, e.g. $12^{th}$ or $15^{th}$ harmonic. The suitable harmonic is denoted as target harmonic 602. In a second block 603, an RSSI scan is performed around the Nth harmonic providing a maximum power channel 604. In a third block 605, a tuning to the maximum RSSI channel is performed to provide a PLL word 606. Then a check 607 is performed if a spur is found in 2 out of 3 values. If a spur is found, the final result is reported 608. If no spur is found, the intermediate result is reported 610 and the measurement procedure continues with the first block 601 selecting another suitable harmonic.

The measurement procedure 600 implements a two-step approach with a Step 1 "RSSI based scan" and a Step 2 "Tune FM radio on spur".

The two-step approach can be fully implemented on driver level that runs inside the OS (operating system) and to a certain extent even on application level ("FM radio app") in user space.

To avoid detecting over-the-air FM channels, either 101.7 MHz (15th harmonic) can be chosen (if inside Japan) or 81.36 MHz (12th harmonic) can be chosen (if outside of Japan), as these frequencies are not occupied by any commercial radios (see FIG. 5). As there is still some probability left over that other disturbances are occupying the spectrum (e.g. EMI noise or military radios), a second and third measurement on two other harmonics falling into FM radio band can be done, enabling a two out of three decision, if the spur is there or not.

In Step 1 "RSSI based scan", first a regular FMR band scan is requested that spans ±300 kHz around the nominal frequency (e.g. 101.7 MHz) with a 50 kHz grid. If there is no FM channel on top of the A4WP spurious harmonic, the maximum RSSI will correspond to the 50 kHz bin which is closest to the spurious harmonic. This method can be used down to the sensitivity limit of FM radio, which is always better than −102 dBm, but typical in the range of −108 dBm to −110 dBm.

In Step 2 "Tune FM radio on spur", after RSSI scan, the frequency precision is enhanced up to ±25 kHz, which is in the range of ±250 ppm. Depending on the to-be-applied mitigation technique (e.g. coherent spur cancellation) much higher precision is required. To achieve this, it is taken advantage of the FM radio inherent feature, that a silent mono FM radio station (no audio, no stereo pilot) is nothing but a single-tone such as the pilot tone 802 depicted in FIG. 8 and therefore not different from an A4WP harmonic. After tuning on the channel with maximum RSSI, the FM radio frequency tracking loop will lock on the harmonic and track its position relative to the reference frequency crystal of the mobile device. By reading out the channel word of the FM radio PLL, the exact frequency can be calculated. The default frequency tracking loop settings are already sufficient to get in the single digit ppm range. If further precision is required, the evaluation algorithms can still be optimized, being limited only by the stability of A4WP reference and mobile reference clock.

As shown in FIG. 3, the GNSS receiver (which includes a mechanism for detecting jamming signals) can be used as well in case no FMR receiver is present on the mobile device.

Figure 7:
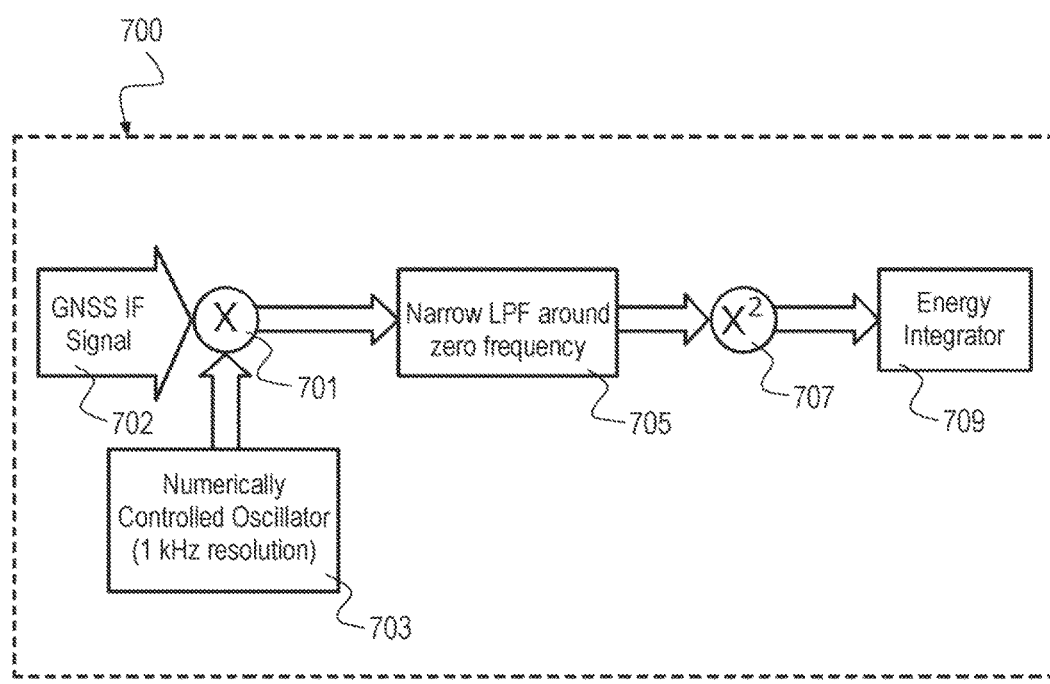
FIG. 7 is a block diagram of a GNSS jammer detection circuit 700 according to the disclosure.

FIG. 7 is a block diagram of a GNSS jammer detection circuit 700 according to the disclosure. The circuit 700 includes a multiplier 701 for multiplying a GNSS IF signal 702 with an output of a numerically controlled oscillator 703 applying 1 kHz resolution. The output of the multiplier 701 is provided to a narrow low pass filter (LPF) 705, then to a square unit 707 and an energy integrator 709.

The circuit 700 shown in FIG. 7 can be used as a variable bandwidth (BW) analyzer to detect the existence of the A4WP PTU harmonic in the following manner: a) Turn off WLAN, BT, FMR and Cellular Modem. b) Activate GNSS RF. c) Tune the NCO of the down-converter to 1572.96+ 3.48 MHz to ensure that the lower edge of the scan band is down converted to 0 Hz. d) Set LPF to 50 KHz. e) Chart a histogram of the received energy, changing the NCO frequency from 1576.33 to 1569.57 in steps of 25 KHz. Note that the Histogram bars will have an overlap of 25% to ensure correct coverage of the full band. f) Monitor for a bin with energy corresponding to A4WP harmonic (typically anything about −120 dBm). g) Inform frequency manager of exact frequency of A4WP jammer.

As can be easily understood, the LPF BW, detection threshold and NCO step can be tuned to reach different levels of sensitivity and accuracy.

In the following a test procedure using the mitigation technique according to the disclosure is described. A) Make sure the mobile device battery is nearly depleted (10% energy left for example). The goal is to ensure the mobile device will start harvesting power as soon as placed on a PTU. B) Make sure the mobile device is associated with a cellular data network (2G/3G/4G) or WLAN access point. Confirm FMR is enabled. The mobile device is then aware of the country in which it operates and the applicable FMR band over which it can receive FM radio stations. C) Place the mobile device on an A4WP charging mat and confirm that wireless power transfer has started (using a H-Field probe for example and observing the 6.78 MHz PTU signal on a spectrum analyzer). D) Probe the antenna port of the FMR receiver and look for its local oscillator (LO) leakage using a spectrum analyzer. If the test is performed in any other country than Japan, the FMR receiver should scan over the International FM radio band (87.5 MHz-108 MHz). The mobile device will scan over the Japan band (76-90 MHz) however with a particular emphasis on the narrow frequency range of 81.18-81.54 MHz (corresponding to the 12th harmonic of the PTU) and the FMR receiver is used as a mean to detect the PTU frequency.

The method according to the disclosure has been checked in laboratory. For hardware tests, an unsynchronized sine signal at ~90.025 MHz has been applied to the FMR receiver input. RSSI scan returns an RSSI value of 235 at 90.00 MHz and an RSSI value of 237 at 90.05 MHz. Therefore 90.05 MHz is selected, which corresponds to a DCO frequency of 6087.8 MHz, a PLL divider of 158.5339 and a PLL programming of DPLL_F_CHAN_INT=158 and DPLL_F_CHAN_FRAC=4478291. Now the frequency tracking was activated which will lock on a channel, which is in this setup, the input tone at ~90.025 MHz. Tracking tunes to a DCO frequency of 6086 MHz, a DPPL_F_CHAN_INT=157 and DPLL_F_CHAN_FRAC=4078772. The frequency of the input signal related to the reference clock signal of the test board can be calculated by calculating the equivalent FM radio channel frequency to:
38.4 $(4078772 \cdot 2^{-23}+158)/68+0.525$ MHz=90.0231 MHz. The offset of (90.0231/90.025)−1=−21.105 ppm of the measured frequency to the offset frequency corresponds to the offset of the test board reference clock frequency to the reference clock frequency of the signal generator. The disclosed method may be implemented on any mobile device having an FM radio driver or GNSS radio driver.

Figure 8:
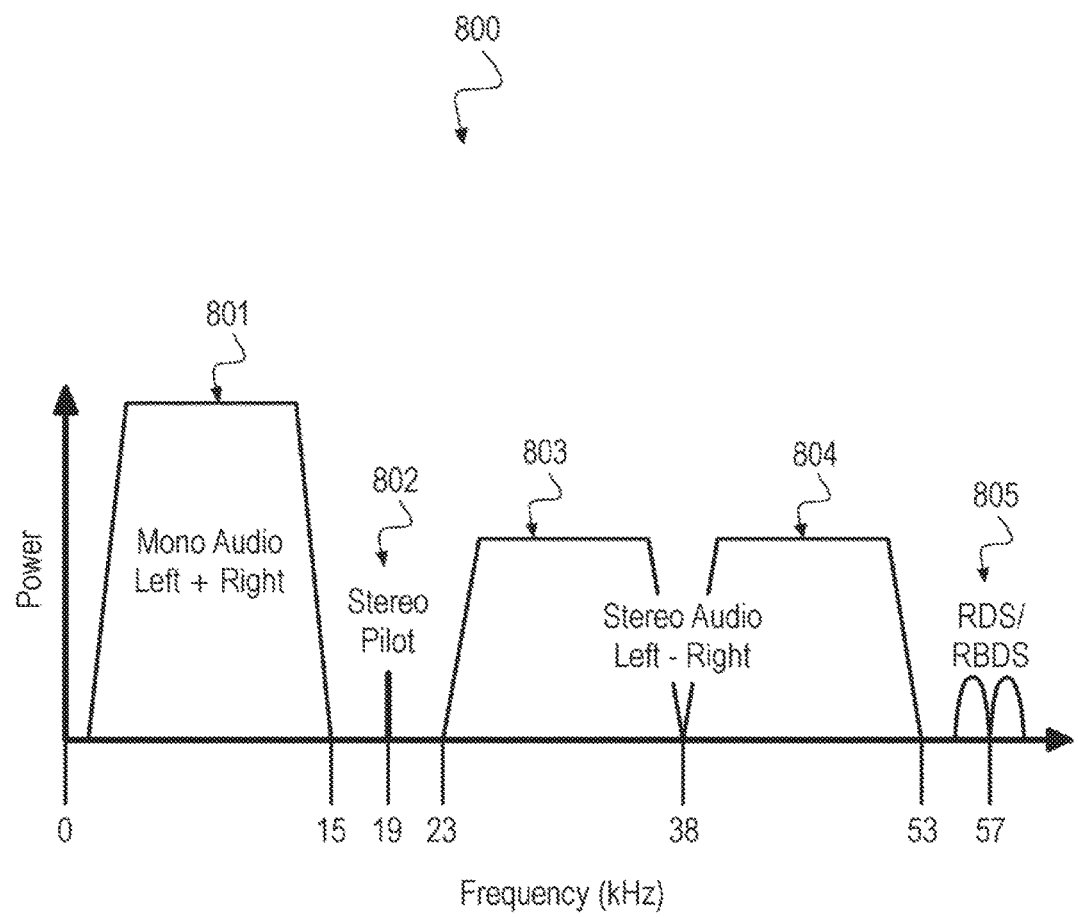
FIG. 8 is a frequency diagram illustrating the baseband spectrum of an exemplary FM stereo signal.

FIG. 8 is a frequency diagram illustrating the baseband spectrum of an exemplary FM stereo signal. The spectrum illustrates a typical baseband spectrum of an FM receiver used in a mobile device, e.g. a handset or a UE.

The FM stereo signal is a stereo multiplex signal which is backwards compatible with a large existing base of FM monophonic receivers. To accomplish this goal, the 0 to 15 kHz baseband part 801 of the multiplex (MPX) signal includes the left (L) and right (R) channel information (L+R) for monophonic reception. Stereophonic sound is achieved by amplitude modulating the (L−R) information onto a suppressed 38 kHz subcarrier in the 23 to 53 kHz region 803, 804 of the baseband spectrum. A 19 kHz pilot tone 802 is added to the multiplex signal to enable FM stereo receivers to detect and decode the stereo left 803 and right 804 channels. The composite baseband signal format meets the backwards compatibility needed for FM mono receivers while simultaneously providing enough information for FM stereo receivers to decode the left and right stereo channel outputs. The MPX signal further includes a 57 kHz subcarrier 805 that carries RDS and RBDS signals.

The radio frequency tracking loop described in 605 with respect to FIG. 6 is capable to lock on the stereo pilot tone 802 and track its position relative to the reference frequency crystal of the mobile device.

Figure 9:
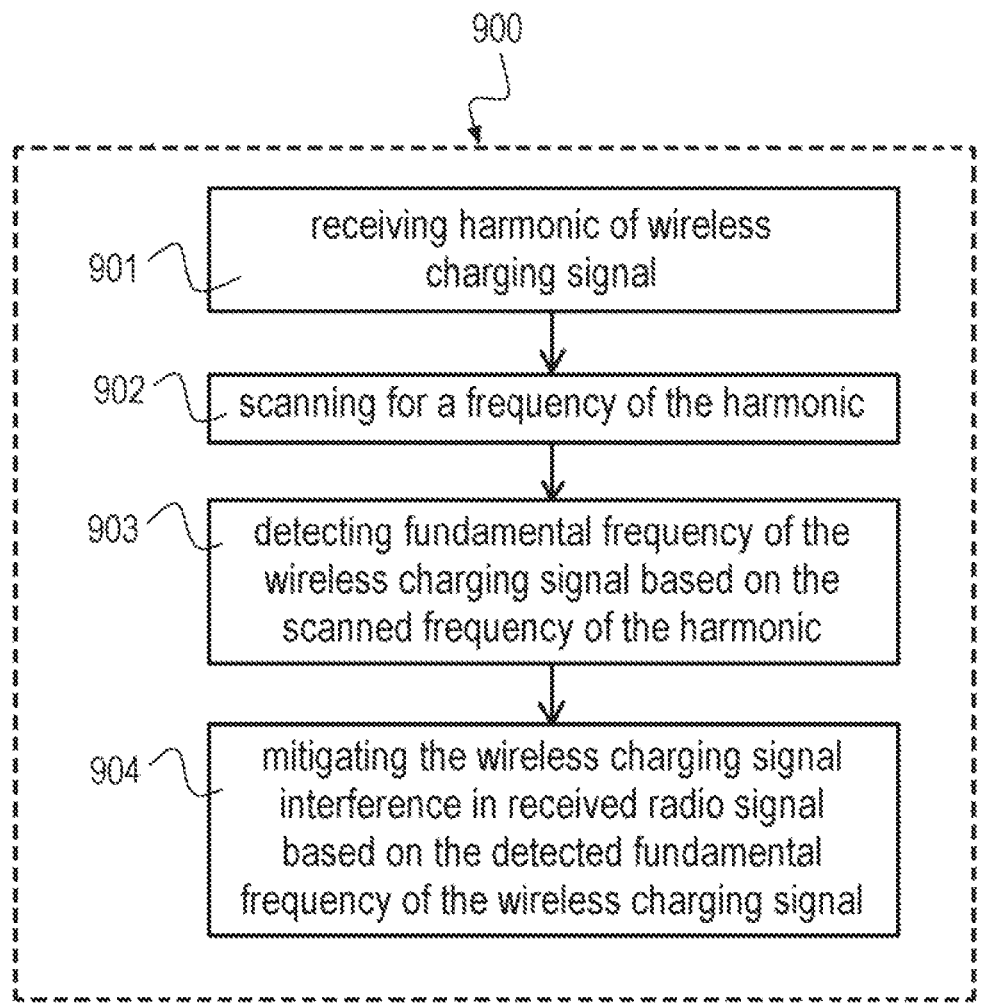
FIG. 9 is a schematic diagram of a method 900 for mitigating a wireless charging signal in a received radio signal.

FIG. 9 is schematic diagram of a method 900 for mitigating a wireless charging interference on a received radio signal in a mobile device.

The method 900 includes receiving 901 a harmonic of the wireless charging signal by a wireless broadcast receiver of the mobile device during charging of the mobile device, e.g. as described above with respect to the wireless broadcast receiver 205 of FIG. 2.

The method 900 includes scanning 902 for a frequency of the harmonic, e.g. as described above with respect to the wireless broadcast receiver 205 of FIG. 2.

The method 900 includes detecting 903 a fundamental frequency of the wireless charging signal based on the scanned frequency of the harmonic, e.g. as described above with respect to the frequency manager 207 of FIG. 2.

The method 900 includes mitigating 904 the wireless charging signal interference in the received radio signal based on the detected fundamental frequency of the wireless charging signal, e.g. as described above with respect to the mitigation module 209 of FIG. 2.

The radio receiver may be a WLAN receiver, a Bluetooth (BT) receiver, a Global Navigation Satellite System (GNSS) receiver, a Frequency modulation radio (FMR) receiver or a cellular mobile receiver or any other radio receiver.

The method 900 may further include receiving the wireless charging signal in an Industrial, Scientific and Medical (ISM) radio frequency band.

A frequency of the wireless charging signal may for example lie within a frequency range of about 6.78 MHz+/−15 kHz. The wireless charging signal may be according to the Alliance for Wireless Power (A4WP) standard.

A key advantage of using FMR or GNSS receivers is that no extra HW is required of any sort (e.g. Silicon, RF front end, antenna, power, etc.) but existing radio HW & FW may be reused with their existing specifications.

Implementation of the technique according to the disclosure does not mandate that the A4WP solution implemented on the handset is a specific device such as a reference design platform, for example, A4WP solution may be in fact a sleeve which integrates the PRU coil, Wireless Power Receiver IC and Bluetooth Low Energy IC. All that is required to trigger the PTU harmonic detection mechanism is an indication that WPT (Wireless Power Transfer) has begun. This fact means that the technique according to the disclosure can be implemented on all handset platforms regardless of whether A4WP is an integral part of the platform or not, e.g. SoC-based or slim-modem based solutions.

The technique according to the disclosure is a system-level solution that can be extended to other wireless systems containing a frequency measurement block and spur-mitigation mechanisms.

In the following a variety of handset use cases are described where wireless charging can very negatively impact user experience: In all cases, handset lays flat on charging pad so very close proximity between handset antennas and charging pad: 1) User listens to music over BT A2DP headset. Only BT active. 2) User holds a phone conversation over BT (eSCO) & Cellular (2G or 3G or VoLTE). BT & Cellular active. 3) User browses internet over WIFI. Only WIFI active. 4) User uses location application (car charging pad for example). Both GNSS & Cellular (3G or LTE) active. 5) User uses handset as WiFi HotSpot (laptop connected to handset over WIFI, Handset provides Cellular data connection). WIFI & Cellular active. 6) User listens to FM Radio with headset. Only FMR active.

By applying techniques according to the disclosure, user experience in some or all of the use cases above can be improved. Note that these use cases represent a non-exhaustive list.

The methods, systems and devices described herein may be implemented as software in a Digital Signal Processor (DSP), in a micro-controller or in any other side-processor or as hardware circuit on a chip or within an application specific integrated circuit (ASIC).

Embodiments described in this disclosure can be implemented in digital electronic circuitry, or in computer hardware, firmware, software, or in combinations thereof, e.g. in available hardware of mobile devices or in new hardware dedicated for processing the methods described herein.

The present disclosure also supports a computer program product including computer executable code or computer executable instructions that, when executed, causes at least one computer to execute the performing and computing blocks described herein, in particular the methods 300, 600 and 900 as described above with respect to FIGS. 3, 6 and 9. Such a computer program product may include a readable non-transitory storage medium storing program code thereon for use by a processor, the program code comprising instructions for performing any of the methods 300 and 900 as described above.

EXAMPLES

The following examples pertain to further embodiments. Example 1 is a mobile device, comprising: a radio receiver configured to receive a radio signal; a power receiving unit (PRU) configured to receive a wireless charging signal from a power transmission unit (PTU) configured to charge the mobile device; a wireless broadcast receiver configured to receive a harmonic of the wireless charging signal during charging of the mobile device; a frequency manager configured to scan for a frequency of the harmonic and to detect a fundamental frequency of the wireless charging signal based on the scanned harmonic; and a mitigation module configured to mitigate a harmonic content of the wireless charging signal in the received radio signal based on the detected fundamental frequency of the wireless charging signal.

In Example 2, the subject matter of Example 1 can optionally include that the radio receiver is one of a WLAN receiver, Bluetooth (BT) receiver, Global Navigation Satellite System (GLASS) receiver, Frequency modulation radio (FMR) receiver or cellular mobile receiver.

In Example 3, the subject matter of any one of Examples 1-2 can optionally include that the power receiving unit (PRU) is configured to receive the wireless charging signal in an Industrial, Scientific and Medical (ISM) radio frequency band.

In Example 4, the subject matter of any one of Examples 1-3 can optionally include that a frequency of the wireless charging signal transmitted by the PTU lies within a frequency range of about 6.78 MHz+/−15 kHz.

In Example 5, the subject matter of any one of Examples 1-4 can optionally include that the PTU and the PRU are designed according to the Alliance for Wireless Power (A4WP) standard.

In Example 6, the subject matter of any one of Examples 1-5 can optionally include that the wireless broadcast receiver is one of a broadcast radio receiver or a broadcast satellite receiver.

In Example 7, the subject matter of Example 6 can optionally include that the broadcast radio receiver is a Frequency modulation radio (FMR) receiver.

In Example 8, the subject matter of Example 7 can optionally include that the frequency manager is configured to scan for a frequency of the harmonic based on country information received by the radio receiver.

In Example 9, the subject matter of Example 8 can optionally include that the frequency manager is configured to scan for a frequency of a fourteenth or fifteenth harmonic of the wireless charging signal if the country code indicates Japan; and that the frequency manager is configured to scan for a frequency of a twelfth harmonic of the wireless charging signal if the country code does not indicate Japan.

In Example 10, the subject matter of any one of Examples 7-9 can optionally include that the frequency manager is configured: to select a harmonic of a plurality of harmonics of the wireless charging signal received by the broadcast receiver for scanning; to perform a received signal strength scan in a frequency range around the selected harmonic with a grid of frequency bins; and to identify a frequency of a maximum of the scanned received signal strengths as the frequency of the selected harmonic.

In Example 11, the subject matter of Example 10 can optionally include that the frequency manager is configured to repeat the received signal strength scan for at least one different harmonic selected from the plurality of harmonics.

In Example 12, the subject matter of any one of Examples 10-11 can optionally include that the FMR receiver comprises a FM radio frequency tracking loop which is configured to lock on a tuned frequency and to track a position of the tuned frequency relative to a reference crystal frequency of the mobile device.

In Example 13, the subject matter of Example 12 can optionally include that the frequency manager is configured to tune the FMR receiver on the identified frequency of the selected harmonic.

In Example 14, the subject matter of Example 13 can optionally include that the frequency manager is configured to retrieve a channel word of the FM radio frequency tracking loop and to increase a precision of the identified frequency of the selected harmonic based on the retrieved channel word.

In Example 15, the subject matter of any one of Examples 10-14 can optionally include that the frequency manager is configured to detect the fundamental frequency of the wireless charging signal based on the identified frequency and a rank of the selected harmonic.

In Example 16, the subject matter of Example 6 can optionally include that the broadcast satellite receiver is a Global Navigation Satellite System (GNSS) receiver.

In Example 17, the subject matter of Example 16 can optionally include that the frequency manager is configured to scan for the 232th harmonic of the wireless charging signal.

In Example 18, the subject matter of Example 17 can optionally include that the GNSS receiver comprises: a numerically controlled oscillator (NCO) configured to provide an NCO frequency; a downconverter to downconvert the received signal by the NCO frequency; a scan filter configured to filter the downconverted signal by a lowpass filter around zero frequency; an energy detector configured to detect an energy of the filtered signal; and an integrator configured to integrate the detected energy of the filtered signal to provide an average energy of the received signal.

In Example 19, the subject matter of Example 18 can optionally include that the frequency manager is configured: to select a harmonic of a plurality of harmonics of the wireless charging signal received by the broadcast receiver for scanning; to perform an energy scan in a frequency range around the selected harmonic by successively tuning the NCO frequency on a grid of frequency bins; and to identify a frequency bin having an average energy corresponding to the selected harmonic of the wireless charging signal.

In Example 20, the subject matter of Example 19 can optionally include that a frequency distance of the grid of frequency bins is smaller than a bandwidth of the lowpass filter.

In Example 21, the subject matter of any one of Examples 19-20 can optionally include that the frequency manager is configured to detect the fundamental frequency of the wireless charging signal based on the identified frequency bin and a rank of the selected harmonic.

Example 22 is a frequency manager for a mobile device comprising a radio receiver for receiving a radio signal, a power receiving unit (PRU) for receiving a wireless charging signal for charging the mobile device, and a wireless broadcast receiver for receiving a harmonic of the wireless charging signal during charging of the mobile device, the frequency manager comprising: a scanner configured to scan for a frequency of the harmonic; a detector configured to detect a fundamental frequency of the wireless charging signal based on the scanned frequency of the harmonic; and an interface to a mitigation module, wherein the interface is configured to transmit the detected fundamental frequency to the mitigation module for mitigating a harmonic content of the wireless charging signal in the received radio signal based on the detected fundamental frequency.

In Example 23, the subject matter of Example 22 can optionally include that the radio receiver is one of a WLAN receiver, Bluetooth (BT) receiver, Global Navigation Satellite System (GLASS) receiver, Frequency modulation radio (FMR) receiver or cellular mobile receiver.

In Example 24, the subject matter of any one of Examples 22-23 can optionally include that the power receiving unit (PRU) is configured to receive the wireless charging signal in an Industrial, Scientific and Medical (ISM) radio frequency band.

In Example 25, the subject matter of any one of Examples 22-24 can optionally include that a frequency of the wireless charging signal transmitted by the PTU lies within a frequency range of about 6.78 MHz+/−15 kHz.

In Example 26, the subject matter of any one of Examples 22-25 can optionally include that the PRU is designed according to the Alliance for Wireless Power (A4WP) standard.

In Example 27, the subject matter of any one of Examples 22-26 can optionally include that the wireless broadcast receiver is one of a broadcast radio receiver or a broadcast satellite receiver.

In Example 28, the subject matter of Example 27 can optionally include that the broadcast radio receiver is a Frequency modulation radio (FMR) receiver.

In Example 29, the subject matter of Example 28 can optionally include that the scanner is configured to scan for a frequency of the harmonic based on a country code received by the radio receiver.

In Example 30, the subject matter of Example 29 can optionally include that the scanner is configured to scan for a frequency of a fourteenth or fifteenth harmonic of the wireless charging signal if the country code indicates Japan; and that the scanner is configured to scan for a frequency of a twelfth harmonic of the wireless charging signal if the country code does not indicate Japan.

In Example 31, the subject matter of any one of Examples 28-30 can optionally include that the scanner is configured: to select a harmonic of a plurality of harmonics of the wireless charging signal received by the broadcast receiver for scanning, to perform a received signal strength scan in a frequency range around the selected harmonic with a grid of frequency bins; and to identify a frequency of a maximum of the scanned received signal strengths as the frequency of the selected harmonic.

In Example 32, the subject matter of any one of Examples 28-31 can optionally include that the scanner is configured to repeat the received signal strength scan for at least one different harmonic selected from the plurality of harmonics.

In Example 33, the subject matter of any one of Examples 31-32 can optionally include that the FMR receiver comprises a FM radio frequency tracking loop which is configured to lock on a tuned frequency and track a position of the tuned frequency relative to a reference crystal frequency of the mobile device.

In Example 34, the subject matter of Example 33 can optionally include that the scanner is configured to tune the FMR receiver on the identified frequency of the selected harmonic.

In Example 35, the subject matter of Example 34 can optionally include that the scanner is configured to retrieve a channel word of the FM radio frequency tracking loop and to increase a precision of the identified frequency of the selected harmonic of the wireless charging signal based on the retrieved channel word.

In Example 36, the subject matter of any one of Examples 31-35 can optionally include that the detector is configured to detect the fundamental frequency of the wireless charging signal based on the identified frequency and a rank of the selected harmonic.

In Example 37, the subject matter of Example 27 can optionally include that the broadcast satellite receiver is a Global Navigation Satellite System (GNSS) receiver.

In Example 38, the subject matter of Example 37 can optionally include that the scanner is configured to scan for a frequency of a 232th harmonic of the wireless charging signal.

In Example 39, the subject matter of Example 38 can optionally include that the GNSS receiver comprises: a numerically controlled oscillator (NCO) configured to provide an NCO frequency; a downconverter to downconvert the received signal by the NCO frequency; a scan filter configured to filter the downconverted signal by a lowpass filter around zero frequency; an energy detector configured to detect an energy of the filtered signal; and an integrator configured to integrate the detected energy of the filtered signal to provide an average energy of the received signal.

In Example 40, the subject matter of Example 39 can optionally include that the scanner is configured: to select a harmonic of a plurality of harmonics of the wireless charging signal received by the broadcast receiver for scanning; to perform an energy scan in a frequency range around the selected harmonic by successively tuning the NCO frequency on a grid of frequency bins; and to identify a frequency bin having an average energy corresponding to the selected harmonic.

In Example 41, the subject matter of Example 40 can optionally include that a frequency distance of the grid of frequency bins is smaller than a bandwidth of the lowpass filter.

In Example 42, the subject matter of any one of Examples 40-41 can optionally include that the detector is configured to detect the fundamental frequency of the wireless charging signal based on the identified frequency bin and a rank of the selected harmonic.

Example 43 is a method for mitigating a wireless charging signal interference on a radio signal received by a radio receiver of a mobile device, the method comprising: receiving a harmonic of the wireless charging signal by a wireless broadcast receiver of the mobile device during charging of the mobile device; scanning for a frequency of the harmonic; detecting a fundamental frequency of the wireless charging signal based on the scanned frequency of the harmonic; and mitigating the wireless charging signal interference in the received radio signal based on the detected fundamental frequency of the wireless charging signal.

In Example 44, the subject matter of Example 43 can optionally include that the radio receiver is one of a WLAN receiver, Bluetooth (BT) receiver, Global Navigation Satellite System (GLASS) receiver, Frequency modulation radio (FMR) receiver or cellular mobile receiver.

In Example 45, the subject matter of any one of Examples 43-44 can optionally include receiving the wireless charging signal in an Industrial, Scientific and Medical (ISM) radio frequency band.

In Example 46, the subject matter of any one of Examples 43-45 can optionally include that a frequency of the wireless charging signal lies within a frequency range of about 6.78 MHz+/−15 kHz.

In Example 47, the subject matter of any one of Examples 43-46 can optionally include that the wireless charging signal is according to the Alliance for Wireless Power (A4WP) standard.

In Example 48, the subject matter of any one of Examples 43-47 can optionally include that the wireless broadcast receiver is one of a broadcast radio receiver or a broadcast satellite receiver.

In Example 49, the subject matter of Example 48 can optionally include that the broadcast radio receiver is a Frequency modulation radio (FMR) receiver.

In Example 50, the subject matter of Example 49 can optionally include scanning for a frequency of the harmonic based on a country code received by the radio receiver.

In Example 51, the subject matter of Example 50 can optionally include scanning for a frequency of a fourteenth or fifteenth harmonic of the wireless charging signal if the country code indicates Japan; and scanning for a frequency of a twelfth harmonic of the wireless charging signal if the country code does not indicate Japan.

In Example 52, the subject matter of any one of Examples 48-50 can optionally include: selecting a harmonic of a plurality of harmonics of the wireless charging signal received by the broadcast receiver for scanning, performing a received signal strength scan in a frequency range around the selected harmonic with a grid of frequency bins; and identifying a frequency of a maximum of the scanned received signal strengths as the frequency of the selected harmonic.

In Example 53, the subject matter of Example 52 can optionally include repeating the received signal strength scan for at least one different harmonic selected from the plurality of harmonics.

In Example 54, the subject matter of any one of Examples 52-53 can optionally include that the FMR receiver comprises a FM radio frequency tracking loop which is configured to lock on a tuned frequency and track a position of the tuned frequency relative to a reference crystal frequency of the mobile device.

In Example 55, the subject matter of Example 54 can optionally include tuning the FMR receiver on the identified frequency of the selected harmonic of the wireless charging signal.

In Example 56, the subject matter of Example 55 can optionally include retrieving a channel word of the FM radio frequency tracking loop and increasing a precision of the identified frequency of the selected harmonic of the wireless charging signal based on the retrieved channel word.

In Example 57, the subject matter of any one of Examples 52-56 can optionally include detecting the fundamental frequency of the wireless charging signal based on the identified frequency and a rank of the selected harmonic.

In Example 58, the subject matter of Example 48 can optionally include that the broadcast satellite receiver is a Global Navigation Satellite System (GNSS) receiver.

In Example 59, the subject matter of Example 58 can optionally include scanning for a frequency of a 232th harmonic of the wireless charging signal.

In Example 60, the subject matter of Example 59 can optionally include that the GNSS receiver comprises: a numerically controlled oscillator (NCO) configured to provide an NCO frequency; a downconverter to downconvert the received signal by the NCO frequency; a scan filter configured to filter the downconverted signal by a lowpass filter around zero frequency; an energy detector configured to detect an energy of the filtered signal; and an integrator configured to integrate the detected energy of the filtered signal to provide an average energy of the received signal.

In Example 61, the subject matter of Example 60 can optionally include: selecting a harmonic of a plurality of harmonics of the wireless charging signal received by the broadcast receiver for scanning; performing an energy scan in a frequency range around the selected harmonic by successively tuning the NCO frequency on a grid of frequency bins; and identifying a frequency bin having an average energy corresponding to the selected harmonic of the wireless charging signal.

In Example 62, the subject matter of Example 61 can optionally include that a frequency distance of the grid of frequency bins is smaller than a bandwidth of the lowpass filter.

In Example 63, the subject matter of any one of Examples 61-62 can optionally include detecting the fundamental frequency of the wireless charging signal based on the identified frequency bin and a rank of the selected harmonic of the wireless charging signal.

Example 64 is a computer readable non-transitory medium on which computer instructions are stored which when executed by a computer cause the computer to perform the method of any one of Examples 43 to 63.

Example 65 is a mitigation system for mitigating a wireless charging signal interference on a radio signal received by a radio receiver of a mobile device, the mitigation system comprising: a broadcast receiver configured to receive a harmonic of the wireless charging signal during charging of the mobile device; a frequency manager configured to scan for a frequency of the harmonic and to detect a fundamental frequency of the wireless charging signal based on the scanned frequency of the harmonic; and a mitigation module configured to mitigate the wireless charging signal interference in the received radio signal based on the detected fundamental frequency of the wireless charging signal.

In Example 66, the subject matter of Example 65 can optionally include that the radio receiver is one of a WLAN receiver, Bluetooth (BT) receiver, Global Navigation Satellite System (GNSS) receiver, Frequency modulation radio (FMR) receiver or cellular mobile receiver.

Example 67 is a device for mitigating a wireless charging signal interference on a radio signal received by a radio receiver of a mobile device, the device comprising: means for receiving a harmonic of the wireless charging signal during charging of the mobile device; means for scanning for a frequency of the harmonic; means for detecting a fundamental frequency of the wireless charging signal based on the scanned frequency of the harmonic; and means for mitigating the wireless charging signal interference in the received radio signal based on the detected fundamental frequency of the wireless charging signal.

In Example 68, the subject matter of Example 67 can optionally include that the radio receiver is one of a WLAN receiver, Bluetooth (BT) receiver, Global Navigation Satellite System (GNSS) receiver, Frequency modulation radio (FMR) receiver or cellular mobile receiver.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it is understood that aspects of the invention may be implemented in discrete circuits, partially integrated circuits or fully integrated circuits or programming means. Also, the terms "exemplary", "for example" and "e.g." are merely meant as an example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein.

The invention claimed is:

1. A mobile device, comprising:
a radio receiver configured to receive a radio signal;
a power receiving unit (PRU) configured to receive a wireless charging signal from a power transmission unit (PTU) configured to charge the mobile device;
a wireless broadcast receiver configured to receive a harmonic of the wireless charging signal during charging of the mobile device;
a frequency manager configured to scan for a frequency of the harmonic and to detect a fundamental frequency of the wireless charging signal based on the scanned harmonic; and
a mitigation module configured to mitigate a harmonic content of the wireless charging signal in the received radio signal based on the detected fundamental frequency of the wireless charging signal.

2. The mobile device of claim 1,
wherein the radio receiver is one of a WLAN receiver, Bluetooth (BT) receiver, Global Navigation Satellite System (GNSS) receiver, Frequency Modulation Radio (FMR) Receiver or cellular mobile receiver.

3. The mobile device of claim 1,
wherein the power receiving unit (PRU) is configured to receive the wireless charging signal in an Industrial, Scientific and Medical (ISM) radio frequency band.

4. The mobile device of claim 1,
wherein a frequency of the wireless charging signal transmitted by the PTU lies within a frequency range of about 6.78 MHz+/−15 kHz.

5. The mobile device of claim 1,
wherein the PTU and the PRU are designed according to the Alliance for Wireless Power (A4WP) standard.

6. The mobile device of claim 1,
wherein the wireless broadcast receiver is one of a broadcast radio receiver or a broadcast satellite receiver.

7. The mobile device of claim 6,
wherein the broadcast radio receiver is a Frequency Modulation Radio (FMR) Receiver.

8. The mobile device of claim 7,
wherein the frequency manager is configured to scan for a frequency of the harmonic based on country information received by the radio receiver.

9. The mobile device of claim 8,
wherein the frequency manager is configured to scan for a frequency of a fourteenth or fifteenth harmonic of the wireless charging signal if the country code indicates Japan; and wherein the frequency manager is configured to scan for a frequency of a twelfth harmonic of the wireless charging signal if the country code does not indicate Japan.

10. The mobile device of claim 7, wherein the frequency manager is configured:
to select a harmonic of a plurality of harmonics of the wireless charging signal received by the broadcast receiver for scanning;
to perform a received signal strength scan in a frequency range around the selected harmonic with a grid of frequency bins; and
to identify a frequency of a maximum of the scanned received signal strengths as the frequency of the selected harmonic.

11. The mobile device of claim 10, wherein the frequency manager is configured to repeat the received signal strength scan for at least one different harmonic selected from the plurality of harmonics.

12. The mobile device of claim 10, wherein the FMR receiver comprises a FM radio frequency tracking loop which is configured to lock on a tuned frequency and to track a position of the tuned frequency relative to a reference crystal frequency of the mobile device.

13. The mobile device of claim 12, wherein the frequency manager is configured to tune the FMR receiver on the identified frequency of the selected harmonic.

14. A frequency manager for a mobile device comprising a radio receiver for receiving a radio signal, a power receiving unit (PRU) for receiving a wireless charging signal for charging the mobile device, and a wireless broadcast receiver for receiving a harmonic of the wireless charging signal during charging of the mobile device, the frequency manager comprising:
a scanner configured to scan for a frequency of the harmonic;
a detector configured to detect a fundamental frequency of the wireless charging signal based on the scanned frequency of the harmonic; and
an interface to a mitigation module, wherein the interface is configured to transmit the detected fundamental frequency to the mitigation module for mitigating a harmonic content of the wireless charging signal in the received radio signal based on the detected fundamental frequency.

15. The frequency manager of claim 14, wherein the radio receiver is one of a WLAN receiver, Bluetooth (BT) receiver, Global Navigation Satellite System (GNSS) receiver, Frequency Modulation Radio (FMR) Receiver or cellular mobile receiver.

16. The frequency manager of claim 14, wherein the wireless broadcast receiver is one of a broadcast radio receiver or a broadcast satellite receiver.

17. The frequency manager of claim 16, wherein the broadcast satellite receiver is a Global Navigation Satellite System (GNSS) receiver.

18. The frequency manager of claim 17, wherein the scanner is configured to scan for a frequency of a 232th harmonic of the wireless charging signal.

19. The frequency manager of claim 18, wherein the GNSS receiver comprises:
a numerically controlled oscillator (NCO) configured to provide an NCO frequency;
a downconverter to downconvert the received signal by the NCO frequency;
a scan filter configured to filter the downconverted signal by a lowpass filter around zero frequency;
an energy detector configured to detect an energy of the filtered signal; and
an integrator configured to integrate the detected energy of the filtered signal to provide an average energy of the received signal.

20. The frequency manager of claim 19, wherein the scanner is configured:
to select a harmonic of a plurality of harmonics of the wireless charging signal received by the broadcast receiver for scanning;
to perform an energy scan in a frequency range around the selected harmonic by successively tuning the NCO frequency on a grid of frequency bins; and
to identify a frequency bin having an average energy corresponding to the selected harmonic.

21. The frequency manager of claim 20, wherein a frequency distance of the grid of frequency bins is smaller than a bandwidth of the lowpass filter.

22. The frequency manager of claim 20, wherein the detector is configured to detect the fundamental frequency of the wireless charging signal based on the identified frequency bin and a rank of the selected harmonic.

23. A method for mitigating a wireless charging signal interference on a radio signal received by a radio receiver of a mobile device, the method comprising:
receiving a harmonic of the wireless charging signal by a wireless broadcast receiver of the mobile device during charging of the mobile device;
scanning for a frequency of the harmonic;
detecting a fundamental frequency of the wireless charging signal based on the scanned frequency of the harmonic; and
mitigating the wireless charging signal interference in the received radio signal based on the detected fundamental frequency of the wireless charging signal.

24. The method of claim 23, wherein the radio receiver is one of a WLAN receiver, Bluetooth (BT) receiver, Global Navigation Satellite System (GNSS) receiver, Frequency Modulation Radio (FMR) Receiver or cellular mobile receiver.

25. The method of claim 24, wherein the broadcast radio receiver is a Frequency Modulation Radio (FMR) Receiver.

* * * * *